United States Patent [19]
Kantner

[11] Patent Number: 5,548,484
[45] Date of Patent: Aug. 20, 1996

[54] IC CARD-RECEIVING HOST

[75] Inventor: Edward A. Kantner, Raleigh, N.C.

[73] Assignee: ITT Corporation, New York, N.Y.

[21] Appl. No.: 515,718

[22] Filed: Aug. 16, 1995

[51] Int. Cl.$^6$ ........................................ H05K 1/14
[52] U.S. Cl. .................. 361/737; 361/728; 361/752; 361/796; 257/679
[58] Field of Search ........................... 361/728, 736, 361/737, 752, 796, 754, 756, 802; 439/44, 62, 74; 257/679; 174/50; 235/492

[56] References Cited

U.S. PATENT DOCUMENTS

| | | |
|---|---|---|
| 4,668,036 | 5/1987 | Ota . |
| 5,267,876 | 12/1993 | Rupert et al. ........................ 439/540 |
| 5,299,089 | 3/1994 | Lwee . |

Primary Examiner—Gerald P. Tolin
Assistant Examiner—Y. Whang
Attorney, Agent, or Firm—Thomas L. Peterson

[57] ABSTRACT

A card-receiving host having a simple push latch/unlatch mechanism to aid in withdrawal of an inserted IC card. The host (24, FIG. 2) has dual push latch/unlatch mechanisms (54) which allows the card (16) to be fully inserted and latched when first pushed forward, and, after a second push on the card, unlatches the mechanisms and moves the card rearward by an amount predetermined by the latch implementation to facilitate grasping it to pull it out of the host. In one arrangement the host connector has a male pin assembly that is free to move in and out to accommodate the latch lost motion and to provide the means to transfer the latch spring pressure and motion to the IC card for its rearward travel. The host connector male pins are, in this implementation, terminated to the electronic device frame via a flexible cable (94), in another system (FIG. 9), a pair of actuators, (164, 166), are implemented to operate the latch mechanisms and can be implemented such that the second thrust of the card (to unlatch), will cause the card to be pushed out far enough so that the card contacts (50) are substantially unmated from the host connector contacts, (172).

10 Claims, 3 Drawing Sheets

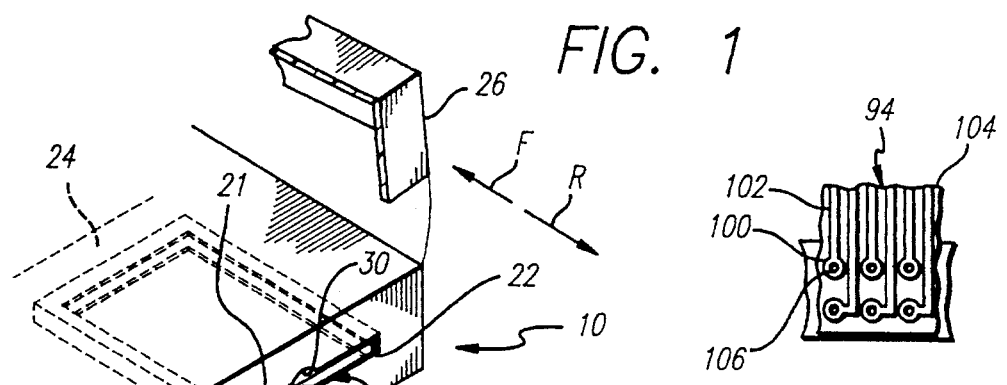
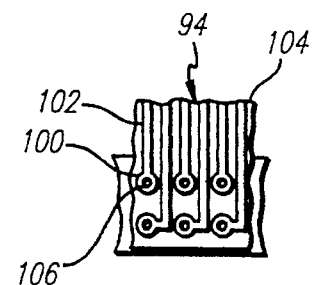
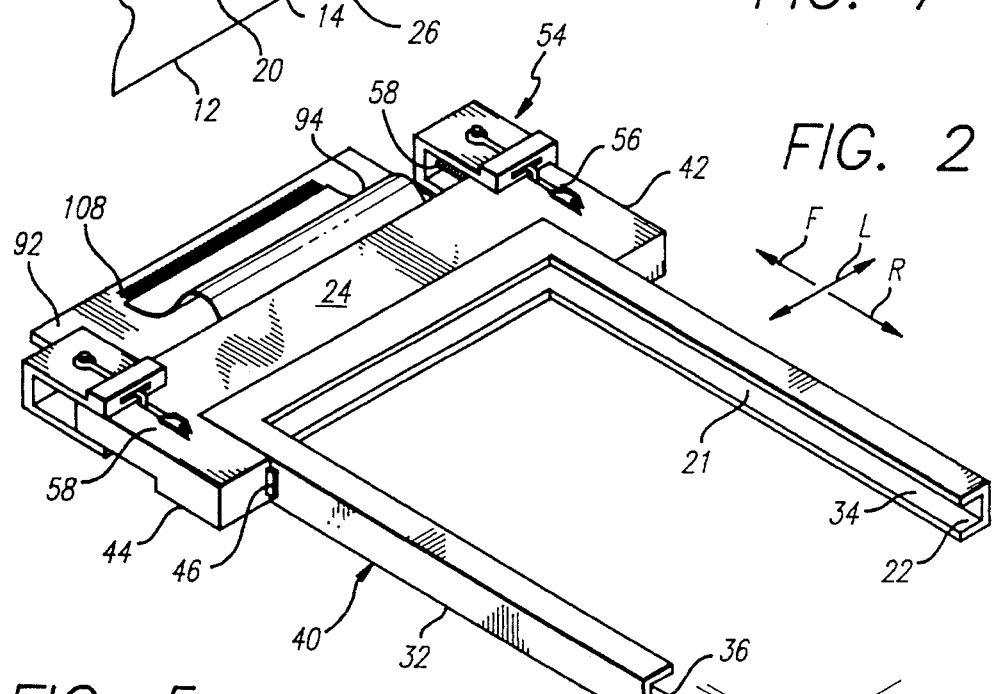
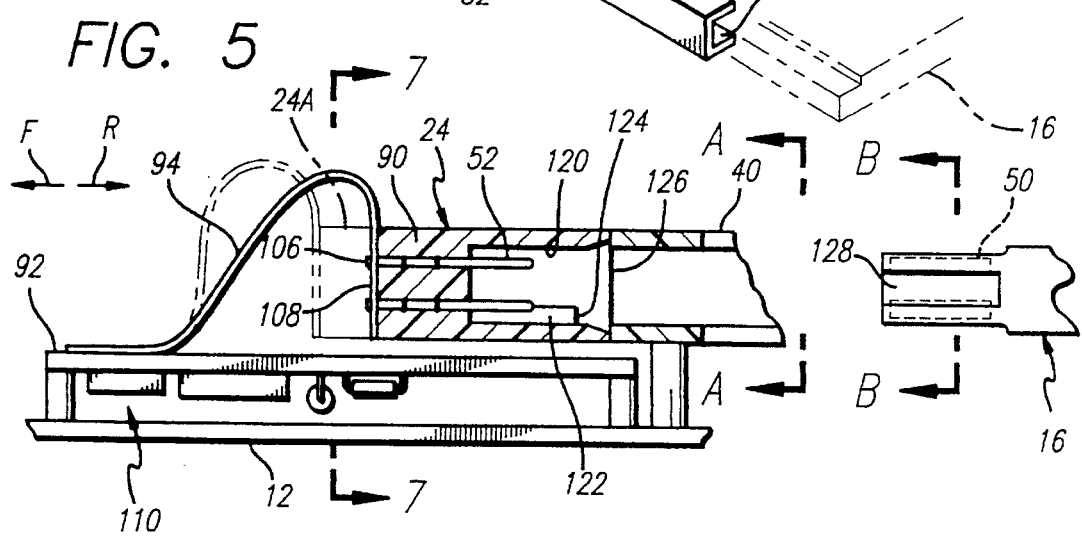

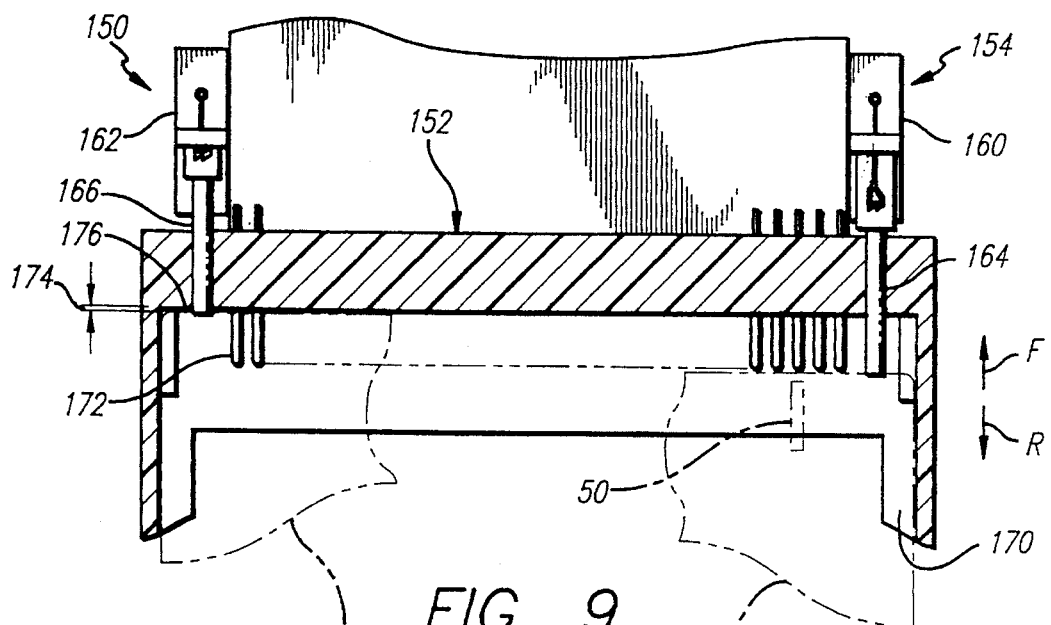
FIG. 9
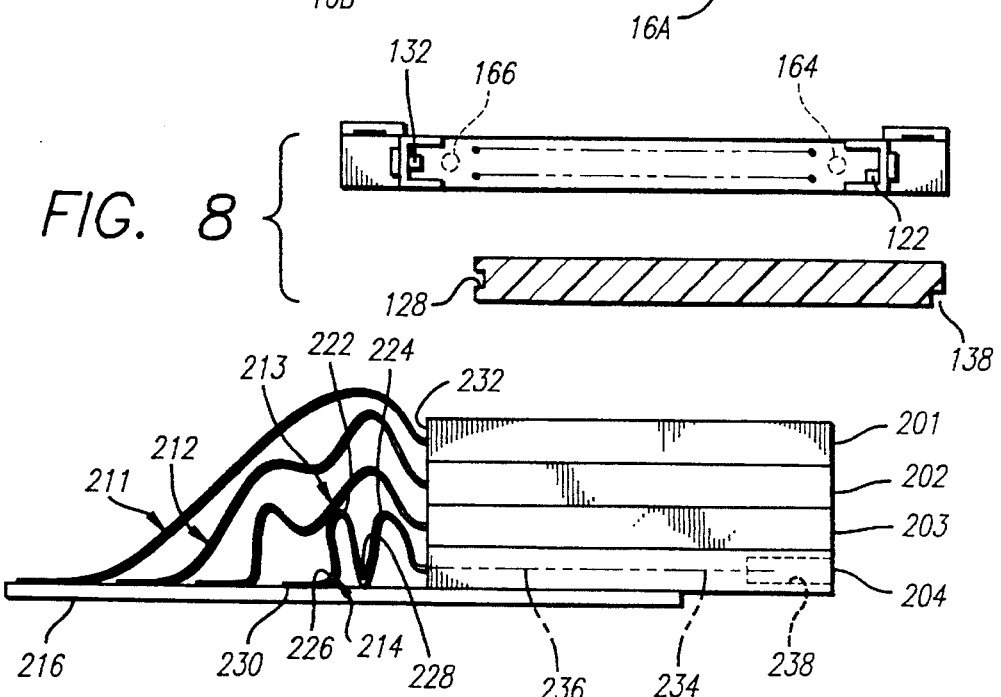
FIG. 8
FIG. 10
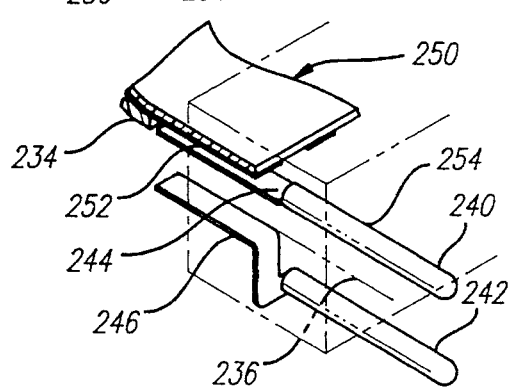
FIG. 11

IC CARD-RECEIVING HOST

BACKGROUND OF THE INVENTION

IC (integrated circuit) cards, which are all about the same width and length as a typical credit card, are designed for insertion into a slot of a card-receiving host which may lie in an electronic device such as a notebook computer. The PCMCIA (Personal Computer Memory Card International Association) specifies the width, length, and heights of a limited number of "standard" IC cards. In some applications, the IC card is inserted fully into a slot, so that it is awkward to pull out the card. Some devices have an eject mechanism with a button that can be depressed to eject the card. An electronic device which enabled retrieval of an inserted card via a push latch mechanism, without a separate push-button mechanism, would have an enhanced appearance and be more convenient to operate. The avoidance of a push button mechanism also could reduce the space taken by such mechanism and avoid breakdowns of such mechanisms.

SUMMARY OF THE INVENTION

In accordance with one embodiment of the present invention, an IC card-receiving host connector assembly and an electronic device that holds such host, are provided, which facilitate rearward removal of a fully inserted card. In one host construction, a host connector (male pin assembly in the case of PCMCIA cards) which mates with a card connector at the front end of the card, is movably mounted on the host connector frame and allowed to move a limited amount in forward and rearward directions. A double-push mechanism is coupled to the host connector and has a spring to bias the host connector rearwardly but to stop such rearward movement at first and second different positions. When the IC card is first thrust forward and released, the mechanism allows the card to remain at a full forward position, where the rear end of the card may project slightly or not at all from the slot. A second forward thrust of the card unlatches the mechanism and allows the spring to push the host connector to a more rearward position so the card projects from the slot and can be more easily pulled out. Host connector movement is accomplished by terminating the contacts through a flat flexible cable to a stationary circuit board.

In another host, the host connector remains stationary, but an actuator or actuators of a double-push mechanism pushes the card rearwardly by several millimeters after a second forward thrust of the card. This causes the card to move rearwardly with respect to the fixed host connector, so the contacts of the card and host connector move out of mating engagement, which also facilitates card removal.

The novel features of the invention are set forth with particularity in the appended claims. The invention will be best understood from the following description when read in conjunction with the accompanying drawings.

BRIEF DESCRIPTION OF THE DRAWINGS

FIG. 1 is a partial isometric view of an electronic device with an IC card fully installed therein, and showing the lid of the electronic device partially opened.

FIG. 2 is an isometric view of the host of the electronic device of FIG. 1, with the host connector in a rearward position.

FIG. 5 is a sectional side view of the host of FIG. 2, showing the host connector in its rearward position in solid lines, and in its forward position in phantom lines.

FIG. 7 is a view taken on line 7—7 of FIG. 5.

FIG. 8 is a view of the host and IC card of FIG. 5, with the host being taken on line A—A of FIG. 5 and with the card being taken on line B—B of FIG. 5.

FIG. 9 is a partial sectional top view of a card-receiving host constructed in accordance with another embodiment of the invention, with the right side of the figure showing a first double-push device and IC card in the rearward position, and with the left side of the figure showing another double-push device and part of a card in a forward position.

FIG. 10 is a side elevation view of a stack of card-receiving hosts connected to a circuit board, of an electronic device of another embodiment of the invention.

FIG. 11 is a partial isometric and sectional view of the apparatus of FIG. 10.

DESCRIPTION OF THE PREFERRED EMBODIMENTS

Figure 3:
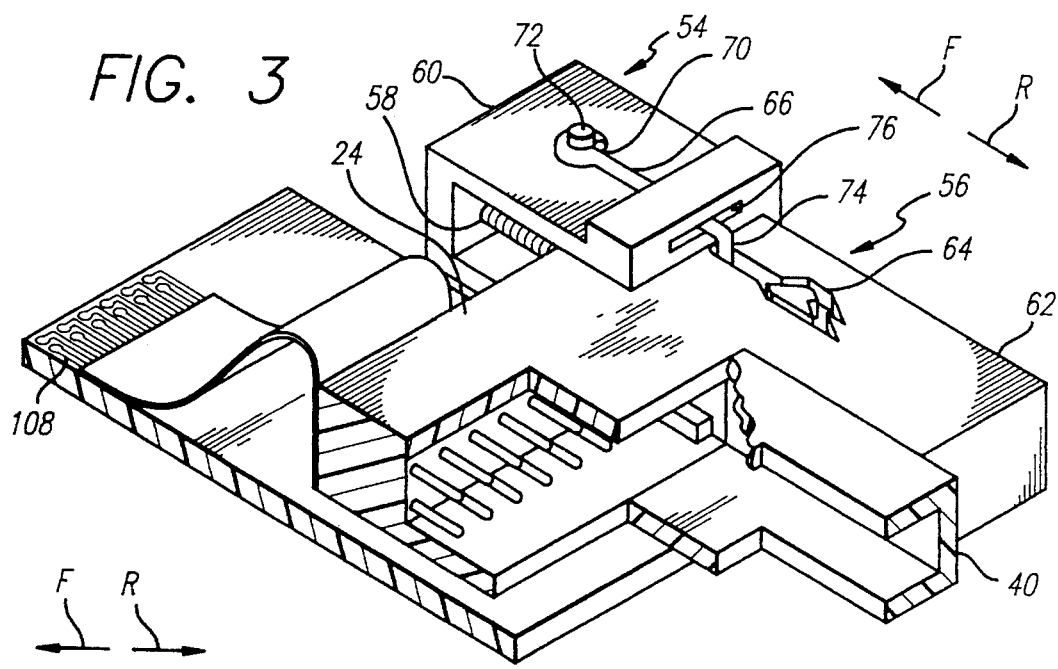
FIG. 3 is a sectional view of a portion of the host of FIG. 2, and also showing the host connector in its rearward position.

FIG. 1 illustrates an electronic device 10 with a housing 12 that has a card-receiving opening 14, and showing a data card or IC (integrated circuit) card 16 which has been fully inserted into the opening. A card-receiving host 20 lies in the electronic device, and has a slot 21 with an open rear end 22 through which the card has been inserted. The card has been inserted until contacts at the front end of the card mate with contacts of a host connector 24 at the rear of the slot. The particular electronic device 10 has a lid 26 which can be closed. If the IC card 16 is to be left in place, then its rear end must not project substantially from the opening 14. As a result, it previously has been difficult for a person to grasp the rear end of the card to pull it out. Some previous electronic devices of this type have a release mechanism with a push button which must be depressed to move out the card enough for it to be grasped, or have some other complicated eject mechanisms of many parts. The present invention avoids the need for such external push button release mechanisms. Instead, to eject a fully inserted card, a person pushes in the forward direction F against the rear edge 26 of the card. Such second thrust or push (following the first push that initially installed the card) causes the card to move rearwardly, in direction R, by several millimeters, so it can be readily grasped and pulled all of the way out of the electronic device. A finger-receiving enlargement 30 can be provided at the middle of the opening to facilitate such second push on the card, or the I/O converter can be used as a handle.

As shown in FIG. 2, the host includes a substantially stationary host frame 40 which forms a card guide member 32 that is fixed to the housing of the electronic device or its mother board. The guide member 32 has opposite sides that each forms a card edge guide 34, 36. The host connector 24 is movable in forward and rearward directions F, R. A pair of sideward extensions 42, 44 at opposite sides of the host connector, are shown slidably engaged with slide guides 46 on the host frame, to guide the host connector in movement. FIG. 5 shows the host connector 24 after it has been moved forwardly to the position 24A. When the IC card 16 is first inserted into the electronic device and moved forwardly, it continues to move forwardly and moves the host connector 24 forwardly to the position 24A, during which socket card contacts 50 mate with pin host contacts 52. The first time that the card is pushed forwardly fully into the electronic device, the host connector moves to the forward position 24A and remains substantially stationary thereat. A second forward thrust on the card 16 causes release of the host connector from its forward position 24A, and allows a spring to move the host connector rearwardly to its initial position at 24.

As shown in FIG. 2, the host includes a double-push mechanism 54 which includes first and second double-push devices 56, 58. As shown in FIG. 3, each double-push device such as 56 of the mechanism 54, includes a stationary receptacle 60 which is fixed to the host frame 40, and a movable part 62 which is fixed to the host connector 24, and that may be integrally molded therewith. The movable part has a camming groove 64. A rod 66 has a forward end 70 pivotally mounted on a post 72 of the receptacle 60 and has a rear end 74 which is received in the camming groove 64. A holddown slot 76 in the receptacle, prevents the rod rear end 74 from moving out of the groove. The rod tends to remain in any position to which it is pivoted.

Figure 6:
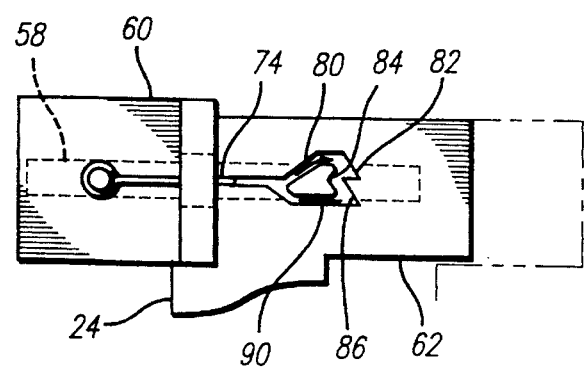
FIG. 6 is a partial plan view of a double-push device of the double-push mechanism of FIG. 2.

As shown in FIG. 6, the rod rear end 74 initially lies in the position shown. When the movable part 62 is moved forwardly, the rod end 74 moves along the path indicated at 80 with respect to the camming groove, until the rod end reaches a first forward stop 82. The stop 82 limits forward movement of the movable part 62 and of the host connector 24. A person pushing in the card senses the sudden resistance to card forward movement and stops pushing forwardly on the card. The movable part 62 then moves rearwardly a small distance, until the rod front end moves against a second stop at 84, under the biasing of the spring 58. The host connector 24 and card remain in the full forward position until it is desired to remove the card.

To remove the card, the person presses slightly forwardly against the rear of the card. This causes the host connector 24 and movable part 62 to move slightly forwardly, until the rod front end 74 abuts a third stop 86. The person readily senses that the card will not move further forward, and releases the card. The front end 74 of the rod then moves along the path 90 back to its original position. The part 62, the host connector 24, and the card all move rearwardly, so the rear of the card projects from the electronic device. In one apparatus that applicant has designed, the card moves rearward by about 8 millimeters the second time it is pushed. It should be noted that this type of double-push mechanism is known for use on furniture to open a cabinet door without requiring a handle on it.

Referring again to FIG. 5, it can be seen that the host contacts 52 are imbedded in a molded dielectric block portion 90 of the host connector. In the past, forward ends of the host contacts were connected to conductive traces on a circuit board 92 by downwardly bent rigid ends of the contacts that entered plated holes of the circuit board. To account for movement of the host connector, connection to the circuit board is made through a flat flexible cable 94. FIG. 7 shows a first or near end 100 of cable conductors 102 that are mounted on a flexible cable insulator 104. Each of the conductors is soldered to a rear end 106 of a host contact 52. Exposed opposite or far ends of the cable conductors are soldered to traces 108 (FIG. 2) on the circuit board. As shown in FIG. 5, the circuit board or circuit device 92 connects the cable to an electronic circuit 110 that includes electronic components mounted at a bottom face of the board. The circuit board 92 and host frame 40 are both substantially fixed to the housing 12 of the electronic device.

The insulator 90 of the host connector 94 forms a hollow rear end 120 of the host connector. Barriers such as 122 lie within the hollow rear end. The rear ends 124 of the barriers lie forward of the extreme rear end 126 of the host contact hollow rear 120. The reason for this is to assure that keyways such as 128 on the card will be accurately guided to receive the barriers 122.

FIG. 8 shows first and second barriers 122, 132, and shows card keyways 128, 138 which receive the barriers. The barriers assure that the IC card will be inserted in a proper orientation (not upside-down) into the slot, and also can prevent insertion of an IC card that is designed for a lower voltage than that at which the electronic device operates.

Figure 4:
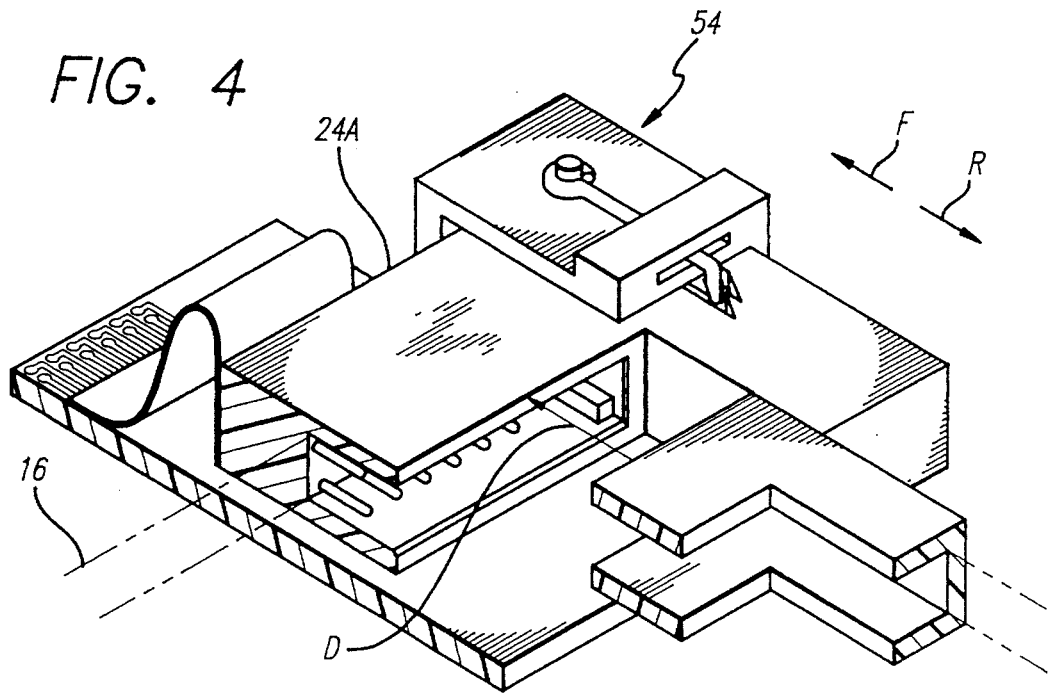
FIG. 4 is a view similar to that of FIG. 3, but showing the host connector in its forward position.

Thus, a person first inserts the IC card 16 of FIG. 1 fully into the slot. As shown in FIG. 4, the first forward thrust of the card 16 causes the host connector to move forward by a predetermined distance such as 10 millimeters, with the card then moved back perhaps 2 millimeters by a spring. As a result, the host connector ends up at its forward position 24A which lies a distance D of perhaps 8 millimeters forward of its initial position at 24. To remove the card, a person pushes forwardly against the rear of the card, which causes the mechanism 54 to move the card forwardly by a small distance of perhaps two millimeters. The mechanism 54 then releases the host connector at 24A to move rearwardly by perhaps ten millimeters to the position 24 shown in FIG. 3, under the biasing of the spring. The second forward push or thrust on the card thereby causes the rear end of the card to project, or project further, from the electronic device.

FIG. 9 illustrates another card-receiving host 150, wherein the host connector 152 is stationary, but a double-push mechanism 154 causes rearward movement of the card after a second forward push against the rear of the card. In this case, the double-push mechanism 154 includes two double-push devices 160, 162 which do not move the host connector, but which move a pair of actuators 164, 166 that push the card rearwardly. The right half of FIG. 9 shows the card 16A prior to its full forward insertion into a card-receiving slot 170. Further forward movement of the card moves it to the fully inserted position shown at 16B at the left side of the figure. Such full insertion causes mating of the host connector contacts 172 with corresponding card contacts 50. The forward movement of the card also causes forward movement of the actuator 166 which causes the double-push mechanism 154 to retain the actuator 166 in its forward position and allow the card to remain in its forward position. Actually, the card moves a small distance 174 (such as two millimeters) rearwardly after its full insertion, but this distance is small and does not affect full mating of the host and card contacts.

A second forward push on the card causes the front end 176 of the card to move forwardly by the small distance 174, which causes the double-push mechanism 154 to release its actuators 164, 166 so they can push the card rearwardly, to the position shown at 16A. At 16A, the rear end of the card not only projects, or projects further, from the electronic device, but also the card contacts have unmated from the host connector contacts 172.

The use of flat flexible cables to connect a card-receiving host to a circuit board, has been known. Previously, the near end of a cable extended vertically, as shown in FIG. 5 for the near end 108. Where an electronic device was constructed to receive two or more IC cards, it might have a stack of adjacent card-receiving hosts, such as shown in FIG. 10 at 201–204. In order to use flat flexible cables for a plurality of hosts, it previously might have required a different length of flat flexible cable for each card-receiving host. Where the cable had to be already installed in the host when the combination was shipped to a customer, this could have required stocking several different hosts, all identical except for different lengths of cables. Applicant avoids the need to carry such inventory, by providing the hosts 201–204 with flat flexible cables 211–214 that are all of the same length. However, in installing the cables on a circuit board 216, applicant flexes the cables so at least one of them extends in an S-shaped loop, such as shown for cable 214. In an S-shaped loop, a cable has an upper surface with at least two convex locations 222, 224, and at least two concave locations 226, 228 on the same upper surface, with one concave location 228 lying between two convex locations 222, 224. Such double folding of the cable permits a cable close to a circuit board location 230 where the cable will be soldered to the board, to lie in place without requiring cutting the cable, and while maintaining the same cable length for all hosts.

If the cables were to all extend vertically from the host rear end 232, then there might be interference of adjacent cables where the hosts lie one immediately above another. That is, a cable portion extending from host 201, might interfere with an upwardly-extending cable extending from host 202. To avoid this, applicant prefers to extend the near end 234 of each cable so it extends substantially in the plane 236 of the card-receiving slot 238 of the corresponding host. FIG. 11 shows contacts 240, 242 having forward portions 244, 246 lying in the same plane. A cable 250 has conductors 252 soldered to corresponding contact forward portions 244, 246, so that the cable near end 234 extends parallel to the plane 236 of the slot and parallel to the pin portions 254 of the contacts 240, 242.

Although terms such as "upper" and "lower" have been used to describe the invention as illustrated, the parts can be used in any orientation with respect to the Earth.

Thus, the invention provides card-receiving hosts which facilitate card removal. In one host, the host connector is movable by a limited distance in forward and rearward directions, and a double-push mechanism is coupled to the host connector so that a second forward push on the card causes the host connector and the card to move further rearwardly. In another host, the host connector is substantially stationary, but actuators of a double-push mechanism push out the card when it is thrust a second part deep into the card-receiving slot of the electronic device. Where stacks of hosts are required, inventory problems are minimized by constructing all hosts with flat flexible cables of the same lengths. Where the cable length is too long, the cable can be stowed in an S configuration.

Although particular embodiments of the invention have been described and illustrated herein, it is recognized that modifications and variations may readily occur to those skilled in the art, and consequently, it is intended that the claims be interpreted to cover such modifications and equivalents.

What is claimed is:

1. A card-receiving host for receiving an IC card that has a card front connector with card contacts, comprising:

a host frame with a card-receiving slot that has an open rear end;

a host connector movably mounted on said frame to move in predetermined forward and rearward directions thereon, said host connector having a plurality of host contacts that are mateable to card contacts of a card front connector when the card is thrust forwardly fully into said slot;

a double-push mechanism coupled to said host connector, said mechanism biasing said host connector rearwardly and stopping rearward movement of the host connector alternately at first and second positions, with said first position lying rearward of said second position, at alternate forward thrusts of said host connector by a card.

2. The host described in claim 1 including:

a circuit board coupled to said host frame to remain substantially stationary with respect to said host frame, said circuit board having a plurality of conductive traces;

at least one flat cable having a plurality of cable conductors, said cable extending between and connected to said host connector and said circuit board with each cable conductor connected to one of said contacts and to one of said traces, said flat cable being flexible to enable it to flex so one cable end can move with said host connector while another cable end remains stationary.

3. The host described in claim 1 wherein:

said host frame includes a guide member having laterally-spaced opposite sides that each forms a card edge guide, said host connector has laterally-spaced opposite sides that are each slidably coupled to said card guide member;

said double-push device mechanism includes a pair of double-push devices that each stops forward movement of a different one of said sides of said host connector alternately at said first and second positions.

4. The host described in claim 1 wherein:

said host frame includes a card guide member having laterally-spaced opposite sides that each forms a card edge guide;

said host connector has a hollow rear end for receiving the front end of an IC card with said hollow rear end having an extreme rear end, and said host connector has a barrier in line with each of said opposite sides of said guide member to engage a different one of the sides of an IC card;

said barriers each lying in said hollow rear end and each barrier having a barrier rear end lying forward of the extreme rear end of said host connector hollow rear end.

5. An electronic device which has a circuit board with a plurality of conductive traces, which has a housing with an opening, and which has a card-receiving host lying in said electronic device wherein:

said host has a card-receiving guide member with a forward end portion and with a rear and that is aligned with said opening to receive an IC card moved forwardly through said opening;

said host includes a host connector with a plurality of pin contacts, said host connector lying at the forward end portion of said guide member and being movably mounted with respect to said host housing to move in forward and rearward directions respectively away from and toward said opening in said housing;

a double-push mechanism which is coupled to said host connector and which biases said host connector rearwardly while stopping its rearward movement alternately at first and second positions;

a flat flexible cable having a plurality of cable conductors, said cable extending between said host connector and said circuit board device and connecting said pin contacts to said traces during movement of said host connector.

6. A card-receiving host for receiving a IC card that has a front card end and a card connector with card contacts lying at its front card end, comprising:

a host with slot walls forming a slot for guiding an IC card in forward movement into said slot, said host including a host connector lying at the rear of said slot, said host connector having a dielectric block substantially fixed in position with respect to said slot wall and having a rear face, and said host connector having at least one laterally-extending row of host contacts fixed in said block, said host contacts having pins projecting rearwardly from said block rear face;

a double push mechanism having an actuator positioned in the path of a card which has been moved forwardly into said slot during a final forward thrust of the card to mate the card connector with the host connector, said mechanism including a spring that biases said actuator rearwardly to urge the card rearwardly out of a mating relationship with the host connector, said mechanism including a double-push device that limits rearward movement of said actuator to a first position at which said host and card contacts remain mated, at every other rearward thrust of said actuator, and which permits rearward movement of said actuator past said first position at every rearward card thrust occurring between said every other rearward thrust.

7. The host described in claim 6 wherein:

said double push mechanism has a pair of actuator members, including said actuator, each actuator member having a rear portion lying laterally beyond a different end of said laterally extending row of contacts.

8. An electronic device that includes a circuit board device with a plurality of rows of conductive traces, and a stack of hosts that comprises a plurality of card-receiving hosts that each has a rearwardly-opening slot for receiving an IC card, a pair of card edge guides at opposite sides of each of said slots, and a host connector at the front of each slot, each host connector having at least one row of laterally-extending contacts, including:

a plurality of flat flexible cables, each cable having a first end portion connected to the contacts of a host connector and extending therefrom, and each cable having a second end portion connected to the traces of one of said row of traces on said circuit board device;

each of said flat flexible cables having the same length, but being differently bent.

9. The device described in claim 8 wherein:

each of said slots lies in an imaginary slot plane, and the front end portion of each of said cables lies in a cable end plane that is substantially parallel to said slot plane.

10. The device described in claim 8 wherein:

at least one of said flat flexible cables extends in a largely S shaped curve with an upper surface that has at least two concave locations and two convex locations with one of said convex locations lying between two of said concave locations.

* * * * *